(12) United States Patent
Elsherbini et al.

(10) Patent No.: US 11,605,603 B2
(45) Date of Patent: Mar. 14, 2023

(54) MICROELECTRONIC PACKAGE WITH RADIO FREQUENCY (RF) CHIPLET

(71) Applicant: Intel Corporation, Santa Clara, CA (US)

(72) Inventors: Adel A. Elsherbini, Chandler, AZ (US); Georgios Dogiamis, Chandler, AZ (US); Telesphor Kamgaing, Chandler, AZ (US); Henning Braunisch, Phoenix, AZ (US); Johanna M. Swan, Scottsdale, AZ (US); Shawna M. Liff, Scottsdale, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 805 days.

(21) Appl. No.: 16/397,718

(22) Filed: Apr. 29, 2019

(65) Prior Publication Data
US 2020/0303329 A1    Sep. 24, 2020

(30) Foreign Application Priority Data

Mar. 22, 2019   (GR) ............................... 20190100133

(51) Int. Cl.
*H01L 27/146*      (2006.01)
*H01L 23/00*       (2006.01)
*H01L 23/66*       (2006.01)

(52) U.S. Cl.
CPC .............. *H01L 23/66* (2013.01); *H01L 24/08* (2013.01); *H01L 24/16* (2013.01);
(Continued)

(58) Field of Classification Search
CPC . H01L 23/66; H01L 24/16; H01L 2223/6627; H01L 2924/1421; H01L 2924/1431
See application file for complete search history.

(56) References Cited

U.S. PATENT DOCUMENTS 8,063,469 B2 * 11/2011 Barth .................... H01L 23/552
                                                 257/659
10,651,559 B2 *  5/2020 Sovero ..................... H01Q 1/24
(Continued)

FOREIGN PATENT DOCUMENTS

EP       2333828 A4    7/2012
WO    2018125183 A1    7/2018

OTHER PUBLICATIONS

EPO Jul. 23, 2020—Extended European Search Report from European Application No. 20156740.1; 9 pages.

*Primary Examiner* — Dale E Page
*Assistant Examiner* — Wilner Jean Baptiste
(74) *Attorney, Agent, or Firm* — Akona IP PC

(57) ABSTRACT

Embodiments may relate to a microelectronic package that includes a radio frequency (RF) chip coupled with a die by interconnects with a first pitch. The RF chip may further be coupled with a waveguide of a package substrate by interconnects with a second pitch that is different than the first pitch. The RF chip may facilitate conveyance of data to the waveguide as an electromagnetic signal with a frequency greater than approximately 20 gigahertz (GHz). Other embodiments may be described or claimed.

15 Claims, 9 Drawing Sheets

(52) U.S. Cl.
CPC ........... *H01L 2223/6616* (2013.01); *H01L 2223/6627* (2013.01); *H01L 2224/08146* (2013.01); *H01L 2224/16225* (2013.01); *H01L 2924/1421* (2013.01); *H01L 2924/1431* (2013.01)

(56) References Cited

U.S. PATENT DOCUMENTS

2009/0079041 A1* 3/2009 Huang ............... H01L 25/0652
257/E23.117
2016/0276729 A1* 9/2016 Dang ..................... H01P 5/107

* cited by examiner

MICROELECTRONIC PACKAGE WITH RADIO FREQUENCY (RF) CHIPLET

CROSS-REFERENCE TO RELATED APPLICATION

This application claims priority to Greek Patent Application No. 20190100133 filed Mar. 22, 2019 and entitled "Microelectronic Package With Radio Frequency (RF) Chiplet", which is hereby incorporated by reference in its entirety herein.

BACKGROUND

Generation, amplification, and detection of high frequencies on legacy silicon logic processes may be challenging. Generally, legacy solutions may require relatively complex packages or interposers to support the ultra-high density required to transmit desired baseband data-rates. Additionally, legacy solutions may require significant amounts of power or circuitry to transmit and receive data between various dies on the package.

DETAILED DESCRIPTION

Figure 1:
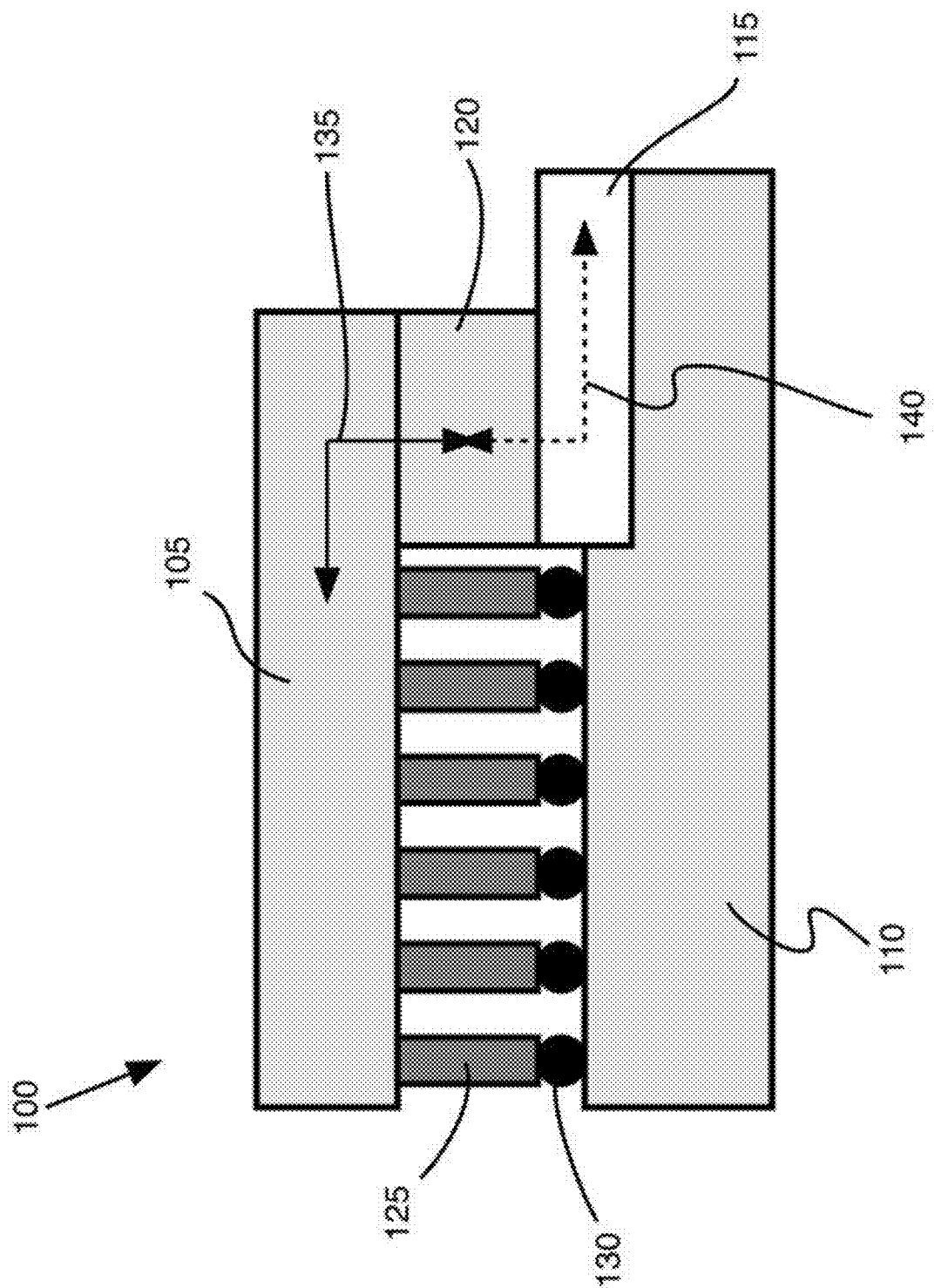
FIG. 1 illustrates a microelectronic package with a radio frequency (RF) chiplet, in accordance with various embodiments herein.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabric.

As previously noted, generation, amplification, and detection of high frequencies on legacy silicon logic processes may be challenging. As used herein, high-frequency signals may refer to signals with a frequency at or above approximately 20 gigahertz (GHz). Such frequencies may be referred to as, for example, millimeter-wave (mmWave) frequencies, which may generally be considered to be between approximately 20 GHz and approximately 300 GHz. In some embodiments, the high frequencies may be greater than approximately 300 GHz, or on the order of 1 terahertz (THz) or above, which may be referred to as THz-frequencies.

Embodiments herein may relate to a compact, ultra-high bandwidth integration scheme which may allow heterogeneous integration of a high-frequency RF semiconductor process (e.g., indium phosphide (InP), silicon germanium (SiGe), gallium arsenide (GaAs) indium gallium arsenide (InGaAs) or gallium nitride (GaN)), or some other type of logic or RF semiconductor chiplet. The integration of such a process or chiplet may have relatively low, or no, impact on the dimensions of the resultant microelectronic package. More specifically, embodiments herein may relate to heterogeneously integrating the RF die in the microelectronic package as a chiplet with the logic die. This integration may allow short and ultra-wide bandwidth interconnects between the logic die and the RF die, which may result in an ultra-high datarate with low power overhead.

Embodiments herein may provide a number of advantages. For example, the communication bandwidth between the logic die and the RF chiplet may be controlled by the pitch of the interconnects between the logic die and the RF chiplet. The communication bandwidth may further be controlled by the datarate of the baseband signals provided by the logic die. Both the pitch and the baseband datarate may be tunable to enable power efficiency and high data-rates. As one example, if each interconnect between the logic die and the RF chiplet can transfer 2 gigabits per second (Gb/s), and the pitch between the interconnects is less than 10 micrometers (microns), then the resultant bandwidth between the RF chiplet and the logic die may be more than 20 terabits per second per millimeter squared (Tb/s/mm$^2$) of the interconnect area. Additionally, embodiments herein may result in a compact solution that may be readily integrated with various types of monolithic or composite chips, or various types of semiconductors.

FIG. 1 illustrates a microelectronic package 100 with an RF chiplet, in accordance with various embodiments herein. Specifically, the microelectronic package 100 may include a logic die 105. The logic die 105 may be, for example, a processor such as a central processing unit (CPU), a general processing unit (GPU), a core of a distributed processor, or some other type of processor. Additionally or alternatively, the logic die 105 may be a memory such as a non-volatile memory (NVM), a flash memory, a double data rate (DDR) memory, a random-access memory (RAM), or some other type of memory. Additionally or alternatively, the logic die 105 may be or include RF baseband logic designed to generate or process one or more signals in accordance with a wireless standard such as a second generation (2G) standard, a third generation (3G) standard, a fourth generation (4G) standard, a fifth generation (5G) standard, a Wi-Fi standard, a Bluetooth standard, a Peripheral Component Interconnect Express (PCIe) standard, IEEE 802.3 standards, or some other high speed input/output (I/O) wired or wireless standard known or hereinafter developed.

The logic die 105 may be coupled with a package substrate 110 by one or more interconnects (which will be described below). The package substrate 110 may be a cored or coreless substrate, and may include one or more dielectric layers of an organic or inorganic material. For example, the package substrate 110 may be made of, or compose, one or more layers of a material such as a build-up film (BUF). In some embodiments, the package substrate 110 may also include one or more conductive elements such as vias, traces, pads, etc. which may not be shown in FIG. 1 for the sake of clarity of the Figure. Specifically, the conductive elements may route one or more data or power signals between different parts of the package substrate 110, different elements coupled with the package substrate 110, or elements within the package substrate 110. In some embodiments, the package substrate 110 may include one or more additional elements such as a die, passive elements like a resistor or capacitor, or some other element either coupled with or within the package substrate 110. These additional elements are likewise not shown for the sake of clarity of FIG. 1.

Generally, the logic die 105 may be coupled with the package substrate 110 by one or more interconnects. As shown in FIG. 1, the interconnects may include a pillar 125 and a solder ball 130. The pillar 125 may be, for example, a copper pillar or some other material that may be used to physically or communicatively coupled, directly or indirectly, the package substrate 110 to the logic die 105. Specifically, the pillar 125 may be used to physically or communicatively couple the logic die 105 to the solder ball 130. The solder ball 130 may be used, for example, to physically or communicatively couple the pillar 125 to the package substrate 110. In some embodiments the solder ball 130 may be considered to be an element of a ball grid array (BGA). In embodiments, such interconnects may allow for communication of other signals such as other data signals, power signals, etc. between the logic die 105 and the package substrate 110.

It will be understood that the interconnect of FIG. 1, which may be considered to include one or both of the pillar 125 and the solder ball 130, is intended as an example of an interconnect in accordance with one embodiment, and other embodiments may have different types of interconnects. For example, in some embodiments the pillars 125 may not be present. In other embodiments the solder balls 130, the pillars 125, or the solder ball 130 and the pillars 125 may be replaced by a different type of interconnect such as a pin of a pin grid array (PGA), an element of a land grid array (LGA), or some other type of interconnect. Additionally, in some embodiments the pillars 125 and the solder balls 130 may be switched such that the pillars 125 are coupled with the package substrate 110 and the solder balls 130 are coupled with the pillars 125. In some embodiments, solder balls 130 may be present on either side of, or in the middle of, the pillars 125. These variations are intended as examples of various different embodiments and other variations may be present in other embodiments.

The package substrate 110 may include a waveguide 115. In some embodiments the waveguide 115 may at least partially protrude from, and be at least partially within, the package substrate 110 as shown in FIG. 1. In other embodiments, the waveguide 115 may be on the surface of the package substrate 110, within but flush with the surface of the package substrate 110, positioned entirely within the package substrate 110, or in some other location with respect to the package substrate 110. Generally, the waveguide 115 may be formed of a relatively low-loss material such as polyethylenetetrafluoride (PTFE), polyethylene (PE), polystyrene, cyclic-olefin-copolymers (CoC), fluoropolymers such as fluorinated ethylene propylene (FEP), ethylene tetrafluoroethylene (ETFE), polyvinylidene fluoride (PVDF) or some other material. The waveguide 115 may be to carry one or more high-frequency electromagnetic signals to or from the die 105 or the microelectronic package 100 in general.

In some embodiments, the waveguide 115 may be directly coupled with the RF chiplet 120 (as shown) while in other embodiments the waveguide 115 may be in a different location of the package substrate 110. The RF chiplet 120 may be coupled with the package substrate 110 and, through the package substrate 110, to the waveguide 115. Generally, descriptions herein will be made with respect to this embodiment as well as other embodiments with reference to the RF chiplet being coupled with the package substrate. It will be understood that this description may (unless explicitly stated otherwise) contemplate situations wherein the RF chiplet is directly coupled with the waveguide in some manner through one or more interconnects or intervening elements, or the RF chiplet is coupled with the package substrate in some manner and, through the package substrate, with the waveguide.

The microelectronic package 100 may be considered to include the RF chiplet 120. Generally, the RF chiplet 120 may be physically coupled with the die 105 and communicatively coupled with the waveguide 115. In some embodiments the RF chiplet 120 may be positioned at least partially between the die 105 and the waveguide 115, as shown in FIG. 1. In other embodiments, the RF chiplet 120 may be at a different location with respect to the die 105 and the waveguide 115, as discussed below in further detail with respect to other Figures.

The RF chiplet may be or include InP, gallium nitride (GaN), or some other high-frequency semiconductor material. The RF chiplet 120 may be configured to convert between a baseband signal 135 and a high-frequency signal 140. Specifically, as described above, the RF chiplet 120 may receive a plurality of baseband signals 135 from the die 105. Each of the baseband signals 135 may, individually, have a relatively low data rate. However, the RF chiplet 120 may combine the data of the received baseband signals 135 and then perform one or more additional processes such as baseband signal conditioning, baseband signal filtering, single-to-differential conversion, pre-emphasis, equalization, upconversion, modulation, amplification, RF filtering, multiplication, signal generation by high-frequency voltage controlled (VC) or injection locked (IL) oscillators or some other process or technique, to generate one or more high-frequency signals 140. The RF chiplet 120 may then transmit, or facilitate the transmission of, the high-frequency signals 140 through the waveguide 115. For example, in some embodiments the RF chiplet 120 may transmit the high-frequency signals 140 directly to the waveguide 115 as shown, and the signal may then propagate through the waveguide 115. In other embodiments, the RF chiplet 120 may output the high-frequency signal 140 to an alternative element such as the die 105, an interposer, or some other element through which the high-frequency signal propagates before entering the waveguide 115. In this embodiment, the RF chiplet 120 may be said to facilitate the transmission of, rather than transmit, the high-frequency signal through the waveguide 115.

In some embodiments, the RF chiplet 120 may have one or more signal launchers positioned therein, which may alter the high-frequency transmission from a mode appropriate for transmission through the RF chiplet 120 to a mode appropriate for transmission through the waveguide 115. The RF chiplet 120, and the signal launcher(s) in specific, may then transmit the high-frequency signal through the waveguide 115. The signal launchers may include, for example, an antenna, opposing conductive plates, a microstrip-to-tapered slotline launcher, a leaky-wave planar launcher, a horn-like launcher or some other type of signal launcher. In other embodiments, the signal launcher may be an element of the waveguide 115, the package substrate 110, or separate from but coupled to one or both of the waveguide 115 and the package substrate 110. As described above, in embodiments where the signal launcher(s) are not an element of the RF chiplet 120, the RF chiplet 120 may be said to facilitate the transmission of, rather than transmit, the high-frequency signal through the waveguide 115.

It will be understood that FIG. 1 is intended as an example embodiment, and other embodiments may have different elements in different locations, or different numbers of elements. For example, various embodiments may have more or fewer interconnects, etc. Some embodiments may have additional active or passive circuitry located on, or within, the logic die 105, the RF chiplet 120, the package substrate 110, etc. In some embodiments the RF chiplet 120 may be located in a different position than depicted, and examples of different configurations may be described in further detail below. Additionally, it will be understood that FIG. 1 is intended to illustrate concepts of an embodiment herein, and the specific sizes or shapes of some elements, either objectively or in relation to one another, may be different in other embodiments. For example, the waveguide 115 may be smaller than illustrated, the package substrate 110 may be larger, etc.

Figure 2:
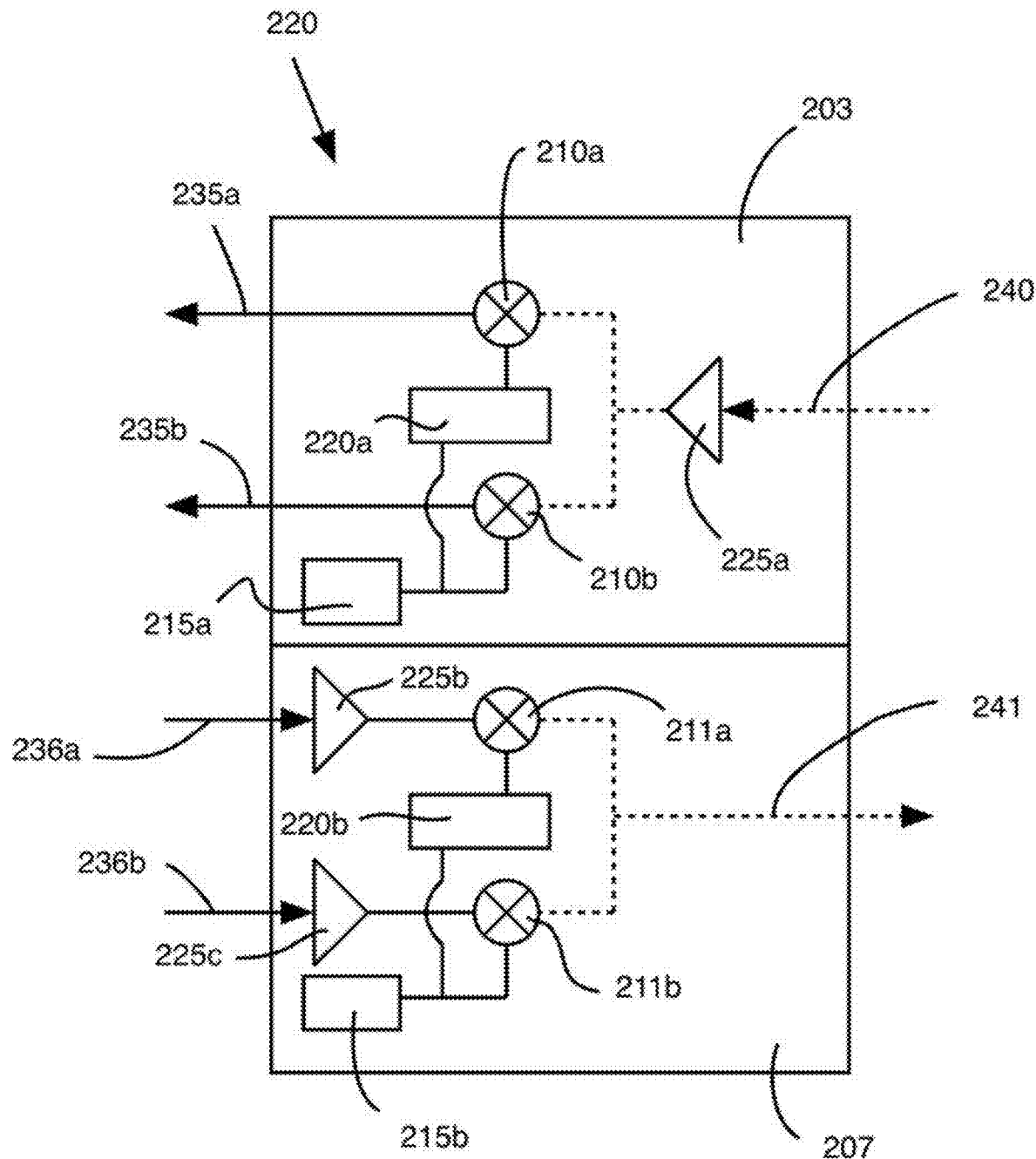
FIG. 2 illustrates example RF circuitry, in accordance with various embodiments herein.

FIG. 2 illustrates example RF circuitry, in accordance with various embodiments herein. Specifically, FIG. 2 may depict an RF chiplet 220 which may be similar to, and share one or more characteristics of, RF chiplet 120. The RF chiplet 220 may be considered to be a transceiver and include both a receiver 203 and a transmitter 207. The receiver 203 may receive a high-frequency signal 240, which may be generally similar to, and share one or more characteristics of, high-frequency signal 140 of FIG. 1. Generally, the high-frequency signal 240 may be received by the receiver 203 and provided to an amplifier 225a of the receiver 203. The amplifier 225a may amplify the signal and provide the signal to demodulators 210a and 210b (collectively, demodulators 210) for further processing. The demodulators 210 may be communicatively coupled with an oscillator 215a which may be configured to provide an oscillating signal (which may also be referred to as a carrier signal) to the demodulators 210. Similarly, one of the demodulators 210a may be coupled with a phase shifter 220a which may delay or otherwise alter the oscillating signal received from the oscillator 215a.

In operation, the amplified received high-frequency signal may be output to the demodulators 210. The demodulators may use the oscillating signal received from the oscillator 215a to demodulate the received high-frequency signal. Additionally, the output of the demodulators 210 may vary from one another because the oscillating signal used by the demodulator 210a may be shifted by the phase shifter 220a, while the oscillating signal used by the demodulator 210b may not be shifted. As a result, the demodulators 210 may output baseband signals 235a and 235b, which may be respectively similar to, and share one or more characteristics of, baseband signal 135. However, the baseband signals 235a and 235b may be different from one another. As a result, it can be seen that the receiver 203 may be able to receive a single high-frequency signal 240 with a relatively high bandwidth and datarate, and produce two baseband signals 235a with a smaller individual bandwidth and datarate, but a generally equivalent bandwidth and datarate to the high-frequency signal 240.

As can be seen, the transmitter 207 may have similar elements to the receiver 203, which may be arranged in a different configuration. Specifically, the transmitter 207 may include an oscillator 215b and a phase shifter 220b, which may be respectively similar to, and share one or more characteristics of, the oscillator 215a and the phase shifter 220a. Similarly, the transmitter 207 may include amplifiers 225b and 225c (collectively, amplifiers 225), which may be similar to, and share one or more characteristics of, amplifier 225a.

The transmitter 207 may also include modulators 211a and 211b (collectively, modulators 211). The modulators 211 may perform a function that is generally opposite that of the demodulators 210 described above. Specifically, amplifiers 225 may receive baseband signals 236a and 236b (which may be similar to, and share one or more characteristics of, baseband signal 135, and which may be collectively referred to as baseband signals 236). The amplifiers 225 may then amplify the baseband signals 236 and provide the amplified signals to modulators 211. The modulators 211 may then process or alter the amplified baseband signals in one or more ways. Specifically, as may be seen, both of the modulators 211 may be coupled with the oscillator 215b, which may provide an oscillating signal to the modulators 211. Additionally, modulator 211a may be coupled with phase shifter 220b, which may shift, invert, or otherwise alter the oscillating signal provided by oscillator 215b. The modulators 211 may then provide the modulated signal which may, collectively, form a high-frequency signal 241 which may be similar to, and share one or more characteristics of, high-frequency signal 140.

It will be understood that the above-described example of the RF chiplet 220 is intended as one example embodiment, and other embodiments may have more or fewer components than depicted in FIG. 2, or the components may be arranged in a different order. For example, in some embodiments the RF chiplet 220 may include one or more upconverters, downconverters, frequency multipliers or some other type of circuitry. Additionally, in some embodiments the RF chiplet 220 may include more or fewer amplifiers, more or fewer modulators or demodulators, etc., and the various elements may be in different locations than depicted in FIG. 2.

Figure 3:
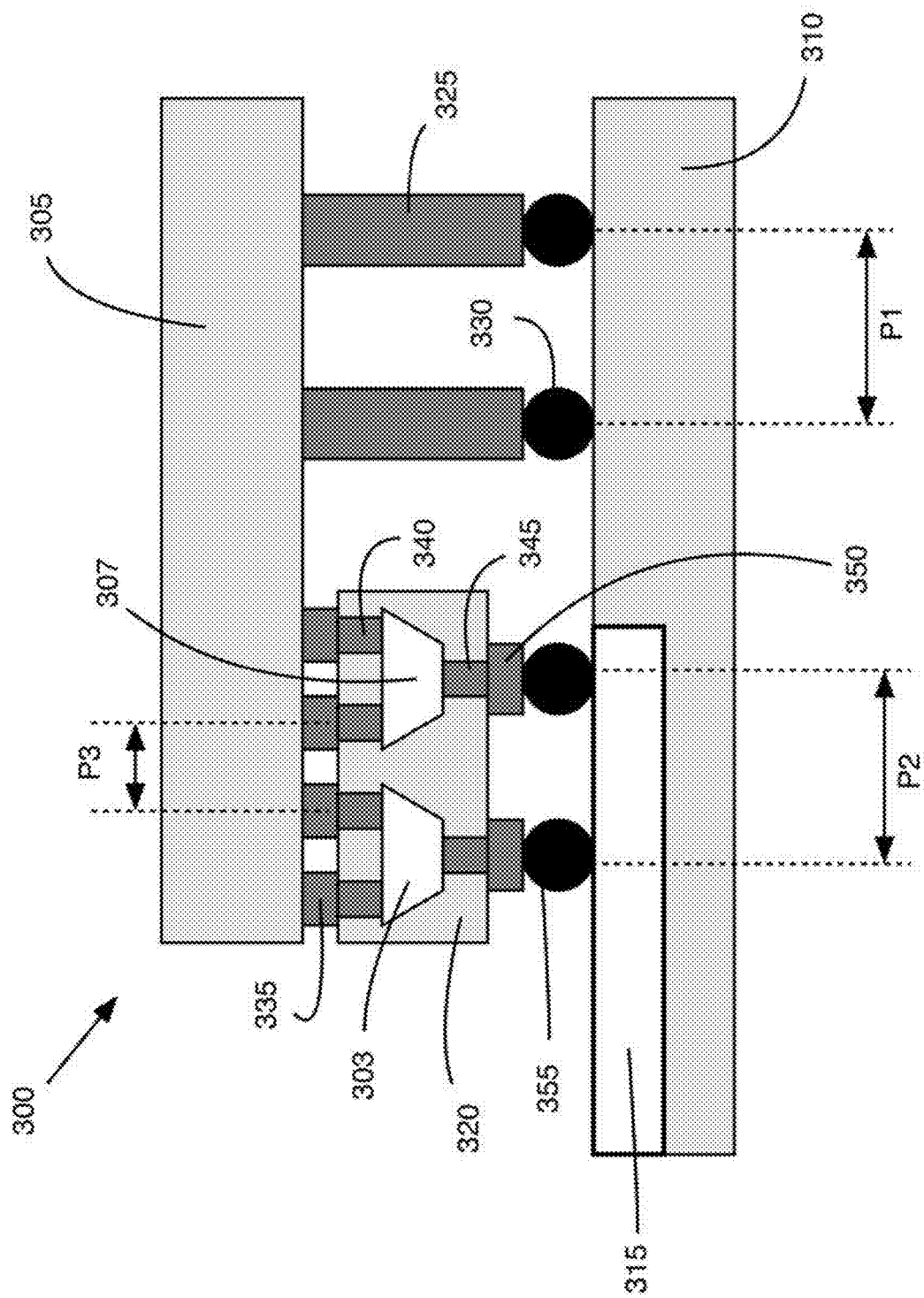
FIG. 3 illustrates an alternative view of a microelectronic package with an RF chiplet, in accordance with various embodiments herein.

FIG. 3 illustrates an alternative view of a microelectronic package with an RF chiplet, in accordance with various embodiments herein. Specifically, FIG. 3 illustrates a more detailed view of a microelectronic package 300, which may be similar to, and share one or more characteristics or elements of, microelectronic package 100 of FIG. 1.

Specifically, the microelectronic package 300 may include a logic die 305 a waveguide 315, and a package substrate 310 which may be respectively similar to, and share one or more characteristics of, logic die 105, waveguide 115, and package substrate 110. The microelectronic package 300 may further include interconnects that include a pillar 325 and a solder ball 330 which may be respectively similar to, and share one or more characteristics of, pillar 125 and solder ball 130. The microelectronic package 300 may further include an RF chiplet 320 with a receiver 303 and a transmitter 307, which may be respectively similar to, and share one or more characteristics of, RF chiplets 120/220, receiver 203, and transmitter 207.

Generally, as can be seen, the RF chiplet 320 may have some amount of z-height (e.g., distance as measured in the vertical direction with respect to the orientation of FIG. 3). The pillar 325 may be desirable to provide a vertical offset for the logic die 305 such that the RF chiplet 320 may be positioned between the logic die 305 and the package substrate 310.

As can be seen in FIG. 3, in some embodiments the RF chiplet 320 may be coupled with the logic die 305 by one or more pads 335. Although the pads 335 are referred to herein as "pads," in other embodiments the pads 335 may be a type of pad or interconnect or some other conductive element that is formed of a conductive material that physically and communicatively couples the RF chiplet 320 to the logic die 305. For example, the baseband signals 235/236/135 may travel through the pads between the RF chiplet 320 and the logic die 305. It will be understood that the depicted pads 335 are intended as one example of type or location of the interconnects, and in other embodiments the pads 335 may be at least partially within the logic die 305. In some embodiments, the pads 335 may be replaced by, or include, one or more additional elements such as additional pads, solder bumps, pins, etc. Similarly, the RF chiplet 320 may be coupled with the package substrate 310 by interconnects that may include pads 350 and solder balls 355.

The interconnects (e.g., the pads 350 and the solder balls 355) may communicatively or physically couple the RF chiplet 320 to the package substrate 310 or the waveguide 315. The solder balls may be similar to, and share one or more characteristics of, solder balls 330. The pads 350 may be similar to, and share one or more characteristics of, pads 335. Similarly to pads 335, in some embodiments one or both of the solder balls 355 or the pads 350 may be replaced by, or include one or more additional elements such as additional pads, bumps, pins, etc. For example, in some embodiments the package substrate 310 may have one or more additional pads positioned either thereon, or at least partially within, which may communicatively and physically couple the solder ball 355 to the package substrate 310. Generally, the interconnects (e.g., the pads 350 and the solder balls 355) may communicatively or physically couple the RF chiplet 320 to the package substrate 310. For example, a high-frequency signal such as high-frequency signals 140 or 240, or 241 may travel through the interconnects between the RF chiplet 320 and the package substrate 310. In another example, a high-frequency signal such as high-frequency signals 140 or 240, or 241 may travel through the interconnects between the RF chiplet 320 and the waveguide 315.

The RF chiplet 320 may include one or more vias 340/345 positioned therein. The vias. The vias 340 may be formed of a conductive material that may communicatively couple elements of the RF chiplet 320 with the pads 335. For example, baseband signals such as baseband signals 135/235/236 may traverse through the vias 340 and the pads 335 between the logic die 305 and the receiver 303 or the transmitter 307. Similarly, vias 345 may communicatively couple the receiver 303 or the transmitter 307 to pad 350 and, more generally, to the package substrate 310. For example, high-frequency signals such as high-frequency signals 240, 241, or 140 may travel through the vias 345.

As can be seen in FIG. 3, the various interconnects may have different pitches as discussed above. As used herein, pitch may refer to a distance from the center of one interconnect to the center of another interconnect as measured in a direction generally parallel to the face of the logic die 305, the package substrate 310, etc. Specifically, as shown in FIG. 3, the pitch may refer to the distance left-right from the center of one interconnect to the center of another.

Specifically, the interconnects that include the solder ball 330 and the pillars 325 may have a first pitch P1. Generally, the pitch P1 may be between approximately 20 and approximately 200 micrometers. The RF chiplet 320 may be coupled with the waveguide 315 by the interconnects that include the pad 350 and the solder ball 355, which may have a pitch P2. Generally, the pitch P2 may be between approximately 0.25 and approximately 2 millimeters. In some embodiments, P2 may be generally equal to P1, while in other embodiments P2 and P1 may be different from one another.

However, the interconnects between the RF chiplet 320 and the logic die 305, for example the interconnect that includes the pads 335, may have a different pitch P3 which may be smaller than pitch P2. In some embodiments, the pitch P3 may be between approximately 1 and approximately 50 micrometers. As noted above, having the pitch P3 be smaller than pitch P2 may be beneficial for a variety of reasons. Specifically, the RF chiplet 320 may receive a plurality of baseband signals from the logic die 305 as discussed and depicted above. The baseband signals may, on aggregate, include a relatively high datarate. The RF chiplet 320 may then convert the baseband signals to high-frequency signals and output the high-frequency signals to the package substrate 310 or waveguide 315 and its associated signal launcher (which, as described above, may be an element of the RF chiplet 320, the package substrate 310, the waveguide 315, or some combination thereof). Such high-frequency signals may not require the same number of interconnects, and so interconnects with a larger pitch P2 may be used to transmit the high-frequency signals. Additionally, the pitch difference between P2 and P3 may provide similar benefits when data is being received by the logic die 305 from the package substrate 310.

Figure 4:
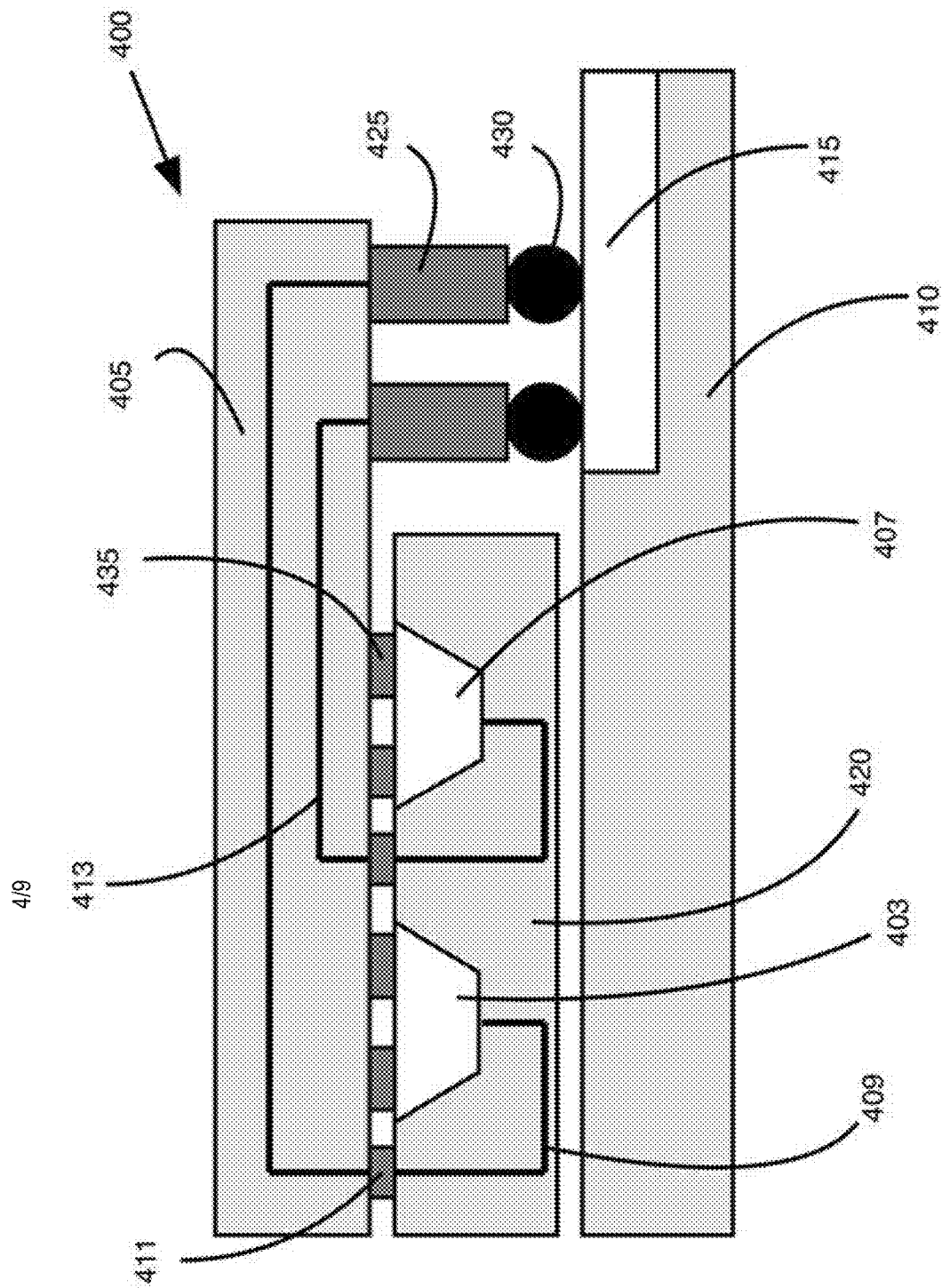
FIG. 4 illustrates an alternative view of a microelectronic package with an RF chiplet, in accordance with various embodiments herein.

FIG. 4 illustrates an alternative view of a microelectronic package with an RF chiplet, in accordance with various embodiments herein. Specifically, FIG. 4 depicts a microelectronic package 400 which may be similar to microelectronic package 300. The microelectronic package 400 may include a logic die 405, an RF chiplet 420, a package substrate 410, a waveguide 415, pillars 425, and solder balls 430 which may be respectively similar to, and share one or more characteristics of, logic die 305, RF chiplet 320, package substrate 310, waveguide 315, pillars 325, and solder balls 330. The RF chiplet 420 may include a receiver 403 and a transmitter 407, which may be respectively similar to, and share one or more characteristics of, receiver 203 and transmitter 207. The RF chiplet 420 may be coupled with the logic die 405 by pads 435 which may be similar to, and share one or more characteristics of, pads 335.

As can be seen, the RF chiplet 420 may not be directly physically coupled with the package substrate 410 or the waveguide 415. Rather, the RF chiplet 420 may include one or more signal paths 409 through which an electronic signal such as a high-frequency signal may propagate. Similarly, the logic die 405 may include one or more signal pathways 413 through which a high-frequency signal may propagate. The signal pathways 409 and 413 may include one or more vias, traces, etc. Although the signal pathways 409/413 are illustrated as being relatively direct, in other embodiments one or both of the signal pathways 409/413 may take a different route through, or shape within, the RF chiplet 420 or the logic die 405. The signal pathways 409 and 413 may be communicatively or physically coupled with one another by an interconnect such as pad 411, which may be generally similar to, and share one or more characteristics of, pads 435.

As can be seen, the RF chiplet 420, and particularly the transmitter 407 of the RF chiplet 420, may receive a baseband signal from the logic die 405 through pads 435. The transmitter 407 may convert the baseband signal to a high-frequency signal as described above and output the high-frequency signal to signal pathway 409 where it may propagate along signal pathway 409, pad 411, and signal pathway 413 to the pillar 425. It may then traverse the pillar 425 and the solder ball 430 to the waveguide 415. It will be understood that this is a description of transmit functionality and the receive functionality may follow a similar but reverse pathway from the waveguide 415 to the logic die 405, along the signal pathways 409/413, and to the receiver 403 where it may be converted to one or more baseband signals and provided to the logic die 405 through pads 435. In this embodiment, the RF chiplet 420 may be considered to be coupled with the package substrate 410 by the interconnects that include the pillar 425 and the solder ball 430.

Figure 5:
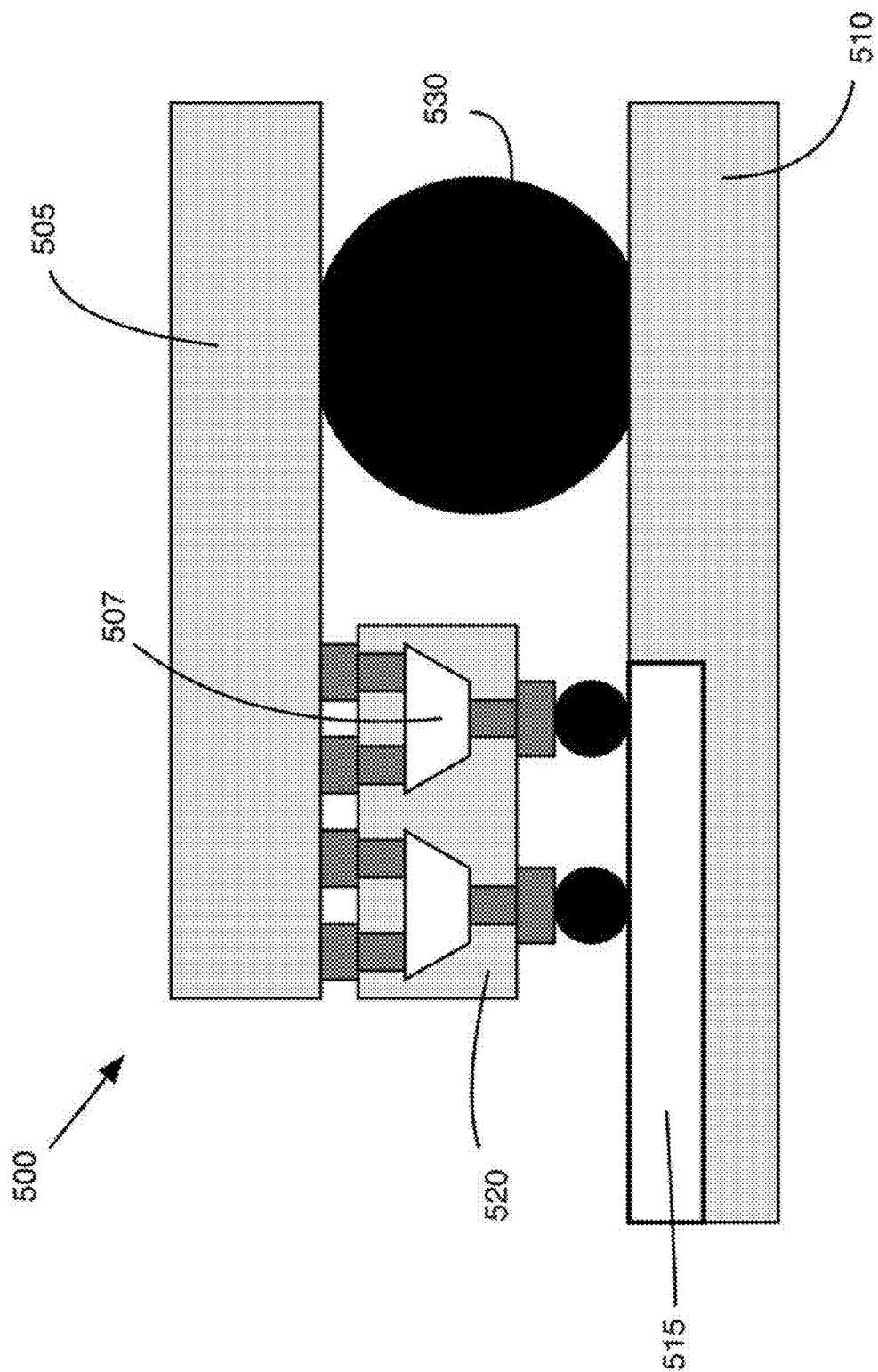
FIG. 5 illustrates an alternative view of a microelectronic package with an RF chiplet, in accordance with various embodiments herein.

FIG. 5 illustrates an alternative view of a microelectronic package with an RF chiplet, in accordance with various embodiments herein. Specifically, FIG. 5 illustrates a microelectronic package 500 which may be similar to microelectronic package 300. It will be understood that for the sake of clarity and lack of repetition, each and every element of FIG. 5 may not be discussed but may be recognized as generally similar to elements depicted in or discussed with respect to other Figures herein.

Generally, the microelectronic package 500 may include a logic die 505, an RF chiplet 520, a package substrate 510, and a waveguide 515 which may be respectively similar to, and share one or more characteristics of, logic die 305, RF chiplet 320, package substrate 310, and waveguide 315. Similarly to other embodiments, the package 500 may include a signal launcher as part of the RF chiplet 520, the package substrate 510, the waveguide 515, or some combination thereof. As can be seen in FIG. 5, rather than pillars 325 and solder balls 330, the interconnect between the logic die 505 and the package substrate 510 may be a solder ball 530 without a pillar. In this embodiment, the scale of the FIG. 5 may be considered to be inaccurate. In some embodiments the solder ball 530 may be the same size generally as solder ball 330. However, the z-height (e.g., the distance top-to-bottom of the microelectronic package 500 with respect to the orientation of FIG. 5) of the RF chiplet 520 may be reduced to the extent that the pillars such as pillars 325 are un-necessary. However, in other embodiments the solder ball 530 may be larger or smaller, and the pillars may still not be present. It will be understood that, similarly to earlier descriptions, the solder ball 530 may be considered to be one example and in other embodiments the solder ball 530 may be replaced by some other type of interconnect such as a pin of a PGA, an element of an LGA, etc.

The space between the logic die 505 and the RF die 520 or the package substrate 510 may include underfill to improve the mechanical performance and reliability. There may be more than one RF chiplet per logic die. Additionally, a waveguide launcher may be part of the package 310 and may be communicatively coupled with solder balls 355/430 and the waveguide 315/415/515.

Figure 6:
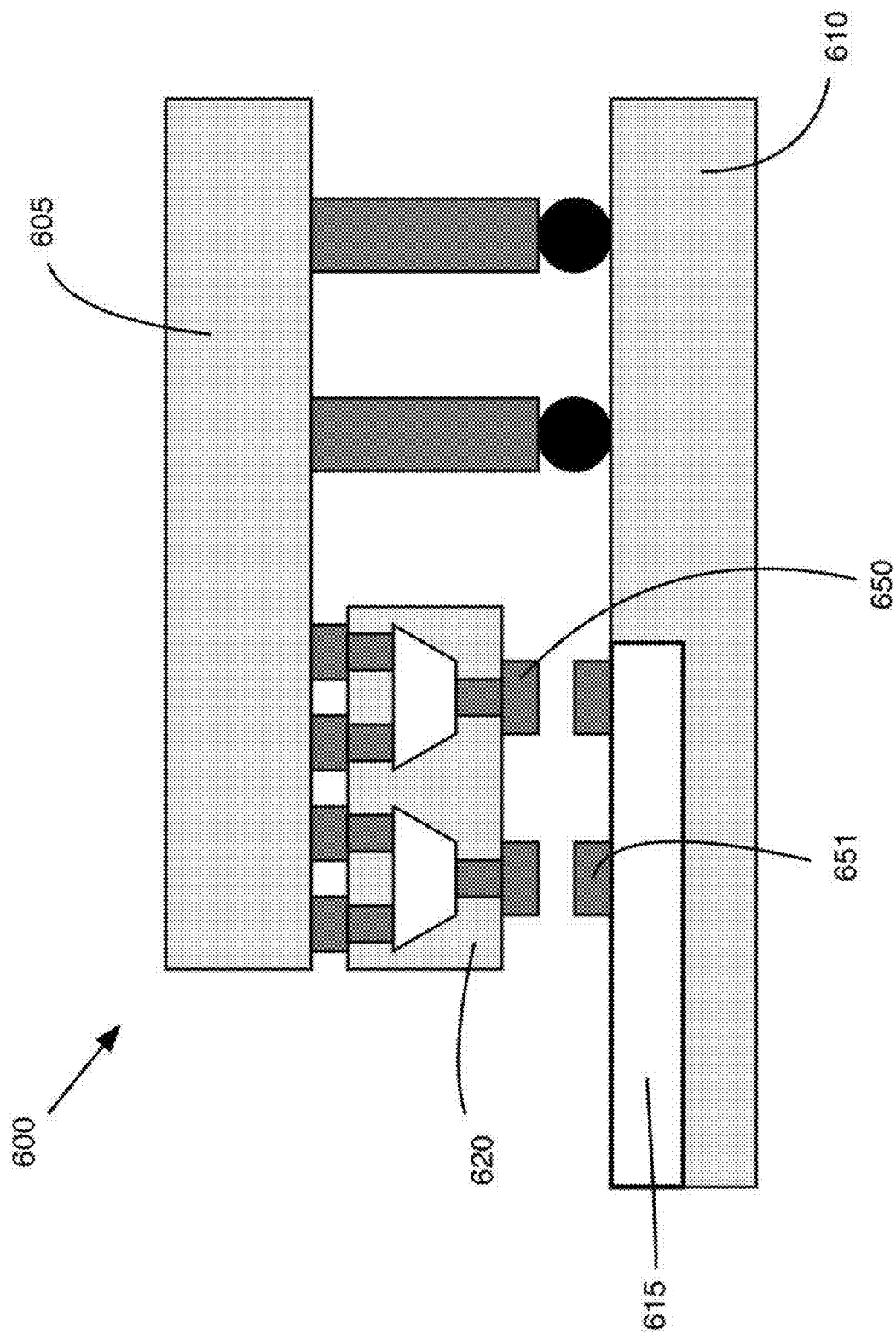
FIG. 6 illustrates an alternative view of a microelectronic package with an RF chiplet, in accordance with various embodiments herein.

FIG. 6 illustrates an alternative view of a microelectronic package with an RF chiplet, in accordance with various embodiments herein. Similarly to FIG. 5, it will be understood that each and every element of FIG. 6 may not be specifically enumerated or discussed, however, elements similar to those of FIG. 3 may be readily identified through comparison of the Figures, and may share characteristics with one another.

Generally, FIG. 6 may include a logic die 605, an RF chiplet 620, a package substrate 610, and a waveguide 615, which may be respectively similar to, and share one or more characteristics of, logic die 305, RF chiplet 320, package substrate 310, and waveguide 315. The RF chiplet 620 may further include one or more pads 650 which may be similar to, and share one or more characteristics of, pads 350.

As can be seen, the RF chiplet 620 may not be directly physically coupled with the package substrate 610 by an interconnect. Rather, the package substrate 610 may include one or more pads 651 which may be capacitively, radiatively, inductively, or otherwise electromagnetically coupled with the pads 650. When the one of the pads 650 or 651 receive a signal such as a high-frequency signal, then the pad may be able to transmit the high-frequency signal to the other of the pads 650 or 650 through a capacitive signal, an electromagnetic signal, etc. In this way, even if the RF chiplet 620 is not directly physically coupled with the package substrate 610, the RF chiplet 620 may still be communicatively coupled with the package substrate 610.

It will be understood that the various embodiments depicted herein are intended as examples of embodiments, and other embodiments may have more, fewer, or different features than depicted. For example, in some embodiments one or more of the various microelectronic packages may have molding or underfill present in, on, or around the package or various elements thereof. Additionally, one or more elements such as the package substrates, logic dies, RF chiplets, etc. may have additional or alternative passive or active components either thereon, partially within, or fully within the element. Additionally, although certain elements such as pads, vias, signal pathways, etc. are depicted as relatively simplistic straight lines, in other embodiments one or more of the elements may more complicated than depicted and include one or more additional conductive pathways along one or more of the various directions. Additionally, unless otherwise indicated, the specific shapes, locations, or sizes of various elements may be different in different embodiments. Other variations may be present.

Figure 7:
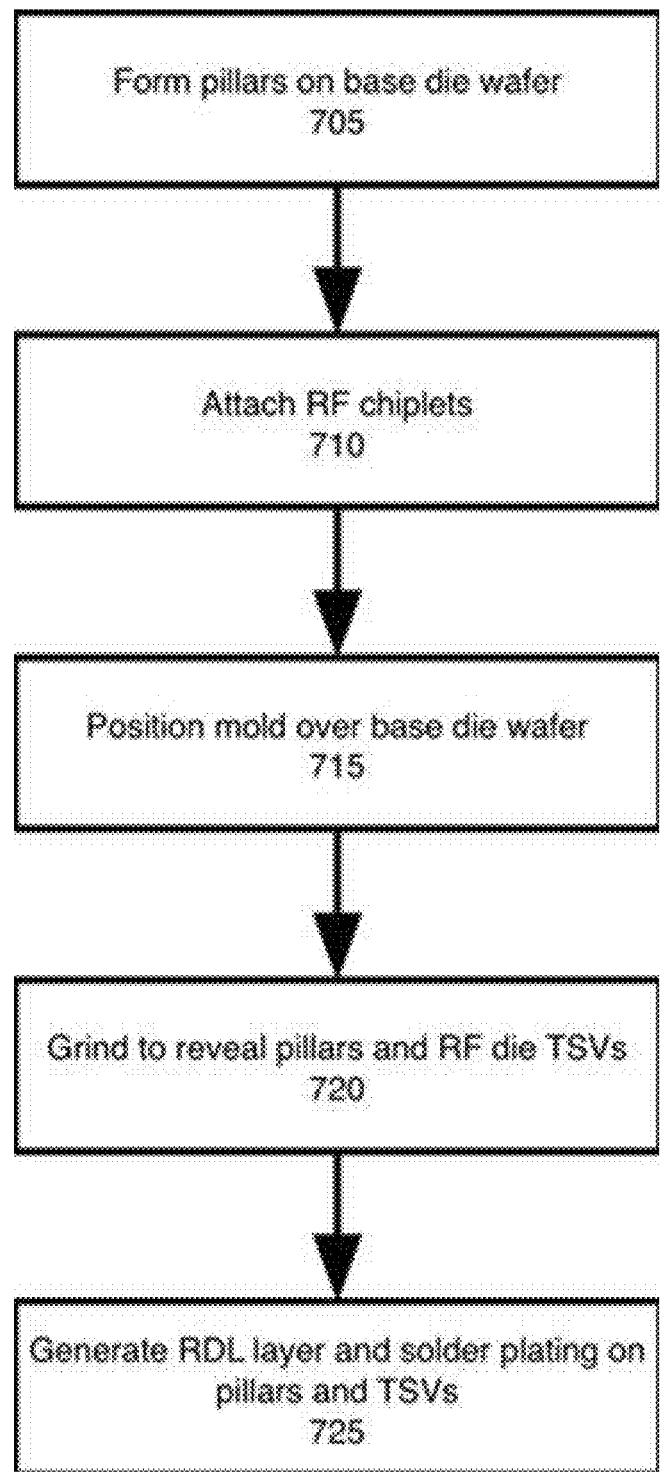
FIG. 7 illustrates an example technique for generating an RF chiplet, in accordance with various embodiments herein.

FIG. 7 illustrates an example technique for generating an RF chiplet, in accordance with various embodiments herein. Specifically, the technique may include forming, at 705, pillars on a base die wafer. The pillars may be similar to, for example, pillars 325 or some other pillar discussed herein. More generally, starting with the base die wafer or a reconstituted wafer, the pillars may be plated onto the wafer itself. The wafer may be, for example, a CPU, a field programmable gate array (FPGA), a network controller, or some other type of wafer. More generally, the base die wafer may include a die such as die 305 or some other die. The pillars may be plated through lithography or some other technique.

The RF chiplets may then be attached at 710. The RF chiplets may be similar to, for example, RF chiplets 320 or some other RF chiplet herein. In some embodiments the RF chiplets may be coupled with the base die wafer via pads such as pads 335. In other embodiments, the RF chiplets may be coupled with the base die wafer through solder interconnects, copper-to-copper bonding, hybrid bonding, etc.

Mold may be positioned over the pillars, RF chiplets, and base die wafer at 715, and then the structure may be ground at 720 to reveal the copper pillars (and the backside vias of the RF chiplets, if applicable). This may allow communicative coupling of the RF chiplet or the pillars, either directly or indirectly, to a package substrate such as package substrate 310.

A redistribution layer (RDL) layer may then be generated and solder plating may be performed on the pillars or TSVs at 725. More specifically, a bump layer may be plated to form, for example, pads such as pads 350 or some other pads. More generally, the bump layer may include copper or solder plating if the final structure is to be attached to a package substrate such as package substrate 310. Alternatively, additional RDL layers may be added (for example to provide additional routing over the RF chiplets) and then the bump layer may be plated. The pitch on the backside of the RF chiplet (e.g., the side of the RF chiplet that is not coupled with the base die wafer) may be larger than the pitch on the side of the RD chiplet that faces the base die wafer, as discussed above. The wafer may then be diced and the singulated modules may continue to further processing steps.

It will be understood that the above-described technique is intended as a highly simplified example, and other embodiments may include more or fewer elements. Additionally, some of the elements may be altered from what is described above to form a structure that includes a RF chiplet.

Figure 8:
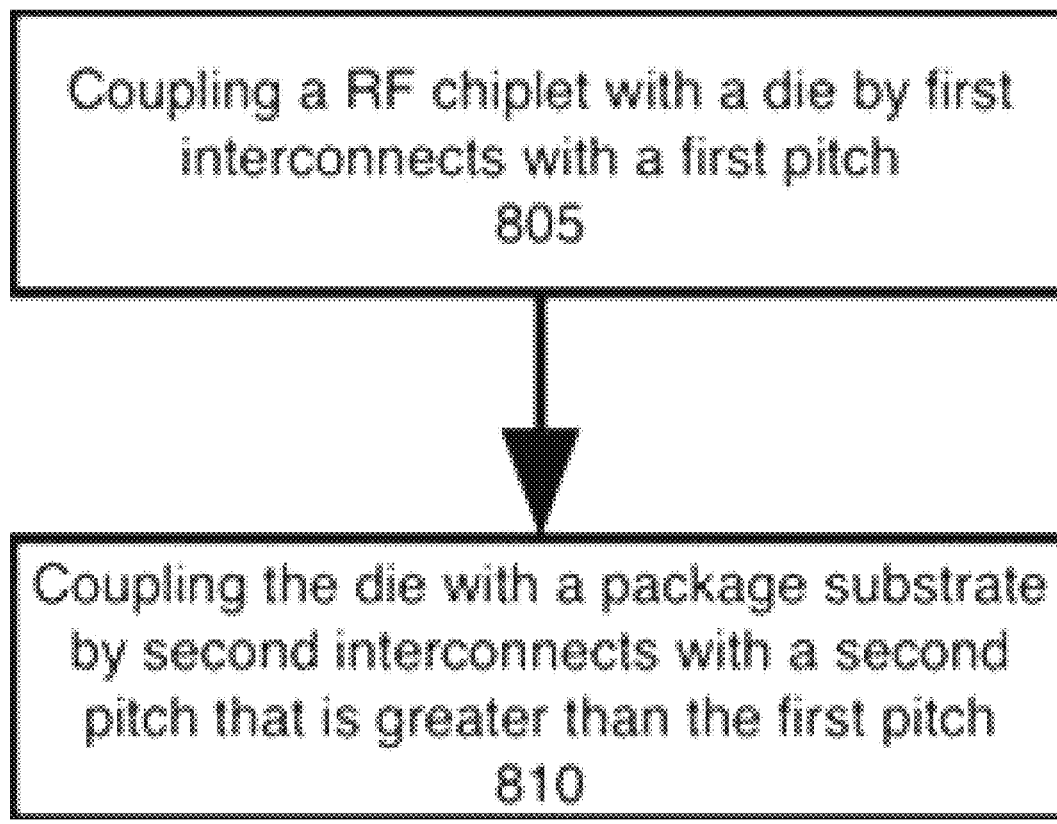
FIG. 8 illustrates an example technique for generating a microelectronic package with an RF chiplet, in accordance with various embodiments herein.

FIG. 8 depicts an example technique for forming a microelectronic package such as microelectronic packages 100, 300, 400, 500, or 600. This embodiment may be described with respect to FIG. 3, however it will be understood that other embodiments of the technique may be applicable to other embodiments of the electronic module.

The technique may include coupling, at 805, an RF chiplet with a die by first interconnects with a first pitch. The RF chiplet may be similar to, for example, RF chiplet 320. The die may be similar to, for example, logic die 305. The pitch of the first interconnects may be, for example, pitch P3.

The technique may then include coupling, at 810, the die with a package substrate by second interconnects with a second pitch that is greater than the first pitch. The package substrate may be similar to, for example, package substrate 310. The second pitch may be, for example, pitches P2 or P1.

Similarly to the embodiment of FIG. 7, it will be understood that this example technique is intended as one sample embodiment, and other embodiments may have more, fewer, or alternative elements. Additionally, some elements may be performed in a different order than shown, or concurrently with one another.

Figure 9:
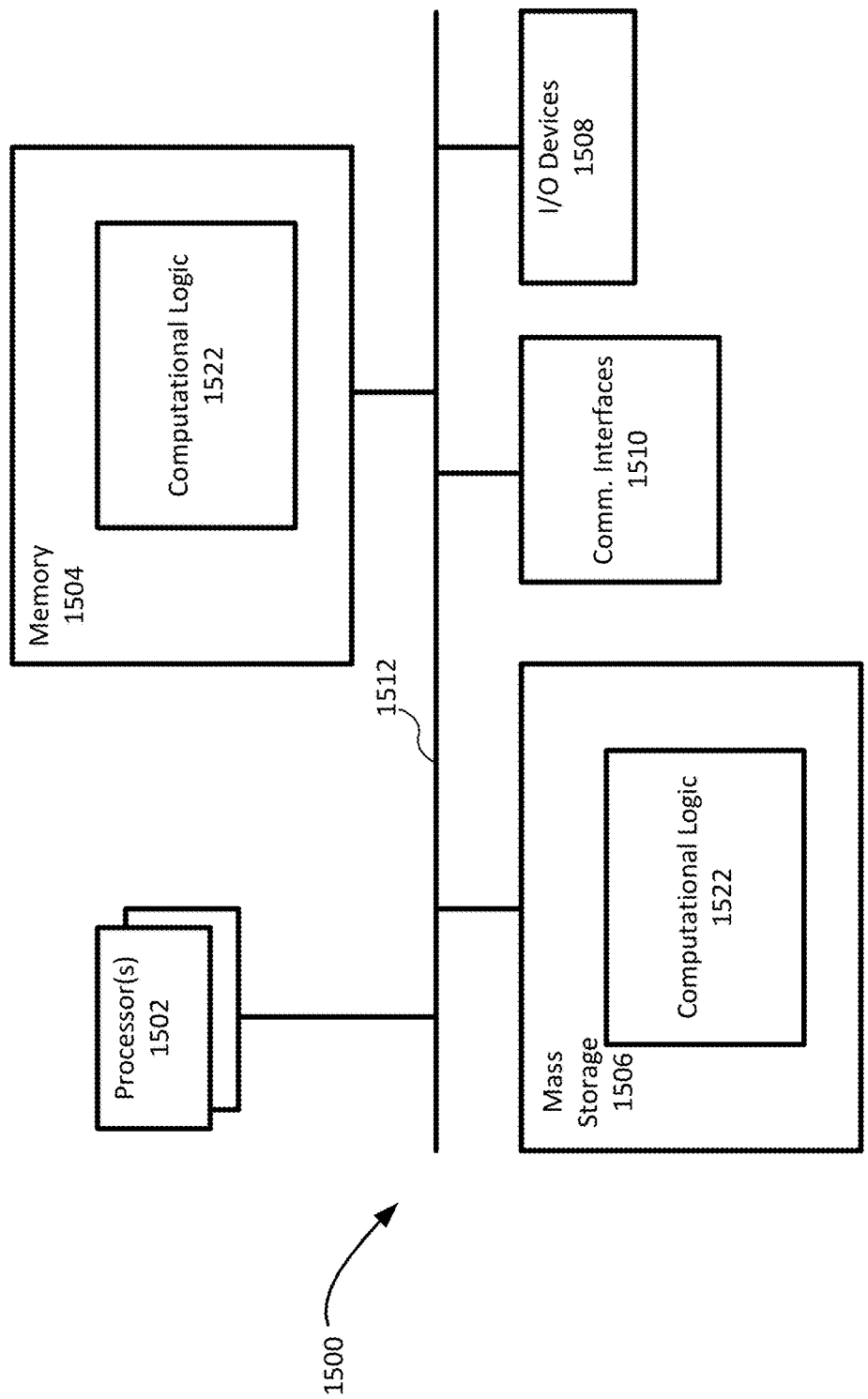
FIG. 9 illustrates an example device that may use various embodiments herein, in accordance with various embodiments.

FIG. 9 illustrates an example computing device 1500 suitable for use with the microelectronic packages 100, 300, 400, 500, or 600, in accordance with various embodiments. Specifically, in some embodiments, the computing device 1500 may include one or more of the microelectronic packages 100, 300, 400, 500, or 600 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid-state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of microelectronic packages 100, 300, 400, 500, or 600, or some other microelectronic package in accordance with this disclosure. For example, in some embodiments the processor 1502, memory 1504, or some other component of the computing device 1500 may be the logic die of a microelectronic package such as logic dies 105, 305, 405, 505, or 605, or some other microelectronic package in accordance with this disclosure.

EXAMPLES OF VARIOUS EMBODIMENTS

Example 1 includes a microelectronic package comprising: a package substrate; a die coupled with the package substrate; a waveguide coupled with the package substrate; and a radio frequency (RF) chip coupled with the die by first interconnects with a first pitch, and the RF chip is further communicatively coupled with the waveguide by second interconnects with a second pitch that is greater than the first pitch; wherein the RF chip is to receive data from the die via the first interconnects, and the RF chip is to facilitate conveyance of the data to the waveguide as an electromagnetic signal with a frequency greater than 20 gigahertz (GHz).

Example 2 includes the microelectronic package of example 1, wherein the RF chip is directly physically coupled with the waveguide by the second interconnects.

Example 3 includes the microelectronic package of example 1, wherein the RF chip is to receive the data from the die as a baseband signal.

Example 4 includes the microelectronic package of example 1, wherein the electromagnetic signal has a frequency greater than 300 GHz.

Example 5 includes the microelectronic package of any of examples 1-4, wherein the RF chip is positioned at least partially between the waveguide and the die.

Example 6 includes the microelectronic package of any of examples 1-4, wherein the waveguide is positioned at least partially within the package substrate.

Example 7 includes the microelectronic package of any of examples 1-4, wherein the RF chip is further to receive a second electromagnetic signal with a frequency greater than 20 GHz and convey data from the second electromagnetic signal to the die.

Example 8 includes a microelectronic package comprising: a package substrate that includes a waveguide; a die coupled with the package substrate by first interconnects with a first pitch; and a radio frequency (RF) chip positioned at least partially adjacent to the first interconnects and coupled with the die by second interconnects with a second pitch that is smaller than the first pitch; wherein the RF chip is to: identify data in a baseband signal received from the die; generate an electromagnetic signal with a frequency of at least 20 gigahertz (GHz), wherein the electromagnetic signal includes the data; and facilitate conveyance of the electromagnetic signal to the waveguide.

Example 9 includes the microelectronic package of example 8, wherein the electromagnetic signal has a frequency of at least 300 GHz.

Example 10 includes the microelectronic package of example 8, wherein the RF chip is physically and communicatively coupled with the waveguide by third interconnects, and wherein the third interconnects have the first pitch, and wherein the RF chip is to facilitate conveyance of the electromagnetic signal to the waveguide via the third interconnects.

Example 11 includes the microelectronic package of example 8, wherein the RF chip is to facilitate conveyance of the electromagnetic signal to the waveguide via the first interconnects.

Example 12 includes the microelectronic package of any of examples 8-11, wherein the first interconnects include one or more pillars positioned between the package substrate and the die.

Example 13 includes the microelectronic package of any of examples 8-11, wherein the RF chip is adjacent to, but not directly physically coupled with, the waveguide, and wherein the RF chip is to facilitate conveyance of the electromagnetic signal to the waveguide via a capacitive or electromagnetic communication.

Example 14 includes the microelectronic package of any of examples 8-11, wherein the waveguide is positioned at least partially within the package substrate.

Example 15 includes a method of forming a microelectronic package, the method comprising: coupling a radio frequency (RF) chip with a die by first interconnects with a first pitch; and coupling the die with a package substrate by second interconnects with a second pitch that is greater than the first pitch; wherein the RF chip is to: receive a baseband signal from a die; generate, based on the baseband signal, an electromagnetic signal with at least a millimeter-wave (mm-Wave) frequency; and facilitate conveyance of the electromagnetic signal to a waveguide of the package substrate.

Example 16 includes the method of example 15, wherein the electromagnetic signal has at least a terahertz (THz)-wave frequency.

Example 17 includes the method of example 15, wherein the electromagnetic signal is a first electromagnetic signal and the baseband signal is a first baseband signal, and wherein the RF chip is further to: identify a second electromagnetic signal that is received from the waveguide, wherein the second electromagnetic signal has at least a mmWave frequency; generate, based on the second electromagnetic signal, a second baseband signal; and facilitate conveyance of the second baseband signal to the die.

Example 18 includes the method of any of examples 15-17, further comprising physically and communicatively coupling the RF chip to the waveguide by third interconnects with a third pitch that is greater than the first pitch.

Example 19 includes the method of any of examples 15-17, further comprising capacitively or electromagnetically coupling the RF chip to the waveguide such that the RF chip is communicatively coupled with the waveguide.

Example 20 includes the method of any of examples 15-17, further comprising communicatively coupling the RF chip with the waveguide by the second interconnects.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
a package substrate;
a die having a first region coupled with the package substrate by first interconnects with a first pitch;
a waveguide coupled with the package substrate; and
a radio frequency (RF) chip coupled with a second region of the die by second interconnects with a second pitch, and further communicatively coupled with the waveguide by third interconnects with a third pitch that is greater than the second pitch, wherein a projection of the first region of the die onto the package substrate is spaced apart from a projection of the second region of the die onto the package substrate;
wherein the RF chip is to receive data from the die via the second interconnects, and the RF chip is to facilitate conveyance of the data to the waveguide as an electromagnetic signal with a frequency greater than 20 gigahertz (GHz).

2. The microelectronic package of claim 1, wherein the RF chip is directly physically coupled with the waveguide by the third interconnects.

3. The microelectronic package of claim 1, wherein the RF chip is to receive the data from the die as a baseband signal.

4. The microelectronic package of claim 1, wherein the electromagnetic signal has a frequency greater than 300 GHz.

5. The microelectronic package of claim 1, wherein the RF chip is positioned at least partially between the waveguide and the die.

6. The microelectronic package of claim 1, wherein the waveguide is positioned at least partially within the package substrate.

7. The microelectronic package of claim 1, wherein the RF chip is further to receive a second electromagnetic signal with a frequency greater than 20 GHz and convey data from the second electromagnetic signal to the die.

8. The microelectronic package of claim 1, further comprising mold between the RF chip and the die.

9. A microelectronic package comprising:
a package substrate that includes a waveguide;
a die coupled with the package substrate by first interconnects with a first pitch; and
a radio frequency (RF) chip positioned at least partially adjacent to the first interconnects and coupled with the die by second interconnects with a second pitch that is smaller than the first pitch;
wherein the RF chip is to:
identify data in a baseband signal received from the die;
generate an electromagnetic signal with a frequency of at least 20 gigahertz (GHz), wherein the electromagnetic signal includes the data; and
facilitate conveyance of the electromagnetic signal to the waveguide.

10. The microelectronic package of claim 9, wherein the electromagnetic signal has a frequency of at least 300 GHz.

11. The microelectronic package of claim 9, wherein the RF chip is physically and communicatively coupled with the waveguide by third interconnects with a third pitch, and wherein the RF chip is to facilitate conveyance of the electromagnetic signal to the waveguide via the third interconnects.

12. The microelectronic package of claim 9, wherein the RF chip is to facilitate conveyance of the electromagnetic signal to the waveguide via the first interconnects.

13. The microelectronic package of claim 9, wherein the first interconnects include one or more pillars positioned between the package substrate and the die.

14. The microelectronic package of claim 9, wherein the RF chip is adjacent to, but not directly physically coupled with, the waveguide, and wherein the RF chip is to facilitate conveyance of the electromagnetic signal to the waveguide via a capacitive or electromagnetic communication.

15. The microelectronic package of claim 9, wherein the waveguide is positioned at least partially within the package substrate.

* * * * *